United States Patent
Peake

(10) Patent No.: US 9,570,605 B1
(45) Date of Patent: Feb. 14, 2017

(54) SEMICONDUCTOR DEVICE HAVING A PLURALITY OF SOURCE LINES BEING LAID IN BOTH X AND Y DIRECTIONS

(71) Applicant: NXP B.V.

(72) Inventor: Steven Thomas Peake, Stockport (GB)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/150,225

(22) Filed: May 9, 2016

(51) Int. Cl.
  *H01L 29/423* (2006.01)
  *H01L 29/78* (2006.01)
  *H01L 29/10* (2006.01)
  *H01L 27/02* (2006.01)
  *H01L 29/66* (2006.01)

(52) U.S. Cl.
  CPC ....... *H01L 29/7813* (2013.01); *H01L 27/0207* (2013.01); *H01L 29/1083* (2013.01); *H01L 29/66734* (2013.01)

(58) Field of Classification Search
  CPC .......... H01L 29/42356; H01L 29/4236; H01L 29/66696; H01L 29/66704; H01L 29/66734; H01L 29/7813; H01L 29/7825
  See application file for complete search history.

(56) References Cited

U.S. PATENT DOCUMENTS

2003/0030087 A1* 2/2003 Ooi ................ H01L 27/105
  257/296

* cited by examiner

*Primary Examiner* — Hoai V Pham
(74) *Attorney, Agent, or Firm* — Rajeev Madnawat

(57) ABSTRACT

A device is disclosed. The device includes a semiconductor substrate, a plurality of source lines formed on a surface of the semiconductor substrate. The plurality of source lines are laid in both X and Y directions. The device further includes a plurality of gate lines laid out over source lines in X direction in the plurality of source lines, a source contact line that connects source lines in the plurality of source lines that are terminating in Y direction, a gate contact line that connects the plurality of gate lines and a drain contact.

9 Claims, 3 Drawing Sheets

SEMICONDUCTOR DEVICE HAVING A PLURALITY OF SOURCE LINES BEING LAID IN BOTH X AND Y DIRECTIONS

BACKGROUND

Trench gate technology is commonly used for improved break down voltage characteristics in semiconductor devices, especially high voltage devices. In the trench gate technology, the gate is vertically buried in the source, typically separated by an isolation cover. Other advantages of the trench gate technology include reduced junction gate field effect transistor (JFET) effect that may be undesirable at least in some applications. However, the trench gate technology does offer some disadvantages when lower voltage configurations are desired due to a need to reduce the width of the embedded gate.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a device is disclosed. The device includes a semiconductor substrate, a plurality of source lines formed on a surface of the semiconductor substrate. The plurality of source lines are laid in both X and Y directions. The device further includes a plurality of gate lines laid out over source lines in X direction in the plurality of source lines, a source contact line that connects source lines in the plurality of source lines that are terminating in Y direction, a gate contact line that connects the plurality of gate lines and a drain contact In some embodiments, the surface of the semiconductor substrate includes an epitaxial layer wherein the top surface of the epitaxial layer includes a p-type body implant. N-type layers run along the source lines in the plurality of source lines in Y direction. The gate lines protrude the surface of the semiconductor surface. An isolation layer exists between the source layer and the gate layer. The isolation layer exists only in X direction. The distance between individual source lines in the plurality of source lines is user defined based for desired electrical characteristics of the device. A second isolation layer is buried in trenches to cover buried parts of the plurality of source lines.

In another embodiment, a process of manufacturing a device is disclosed. The process includes forming an epitaxial layer in top surface of a wafer, forming a body layer in top surface of the epitaxial layer, forming a plurality of source implant strips in Y direction only, forming an intersecting network of trenches including trenches in X and Y directions. The trenches in Y direction cuts through each of the plurality of source implant strips. The process further includes filling trenches in the intersecting network of trenches with a dielectric material, forming source trenches in the dielectric material, filling the source trenches with source polysilicon, forming gate trenches in the source trenches, and filling the gate trenches with gate polysilicon such that a part thereof protrude over the top surface of the wafer.

In some embodiments, prior to filling the gate trenches with gate polysilicon, isolation trenches are formed in the source trenches and filled with an isolation material. The process of forming the source trenches includes forming a source contact trench for forming a source contact strip. Forming the gate trenches includes forming a gate contact trench for forming a gate contact strip.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

It should be noted that the embodiments described herein use n-channel device for example only. A person skilled in the art would realize that these embodiments can also be applied for p-channel devices. Many well-known fabrication steps, components, and connectors have been omitted from the description so as not to obfuscate the present disclosure.

Figure 1:
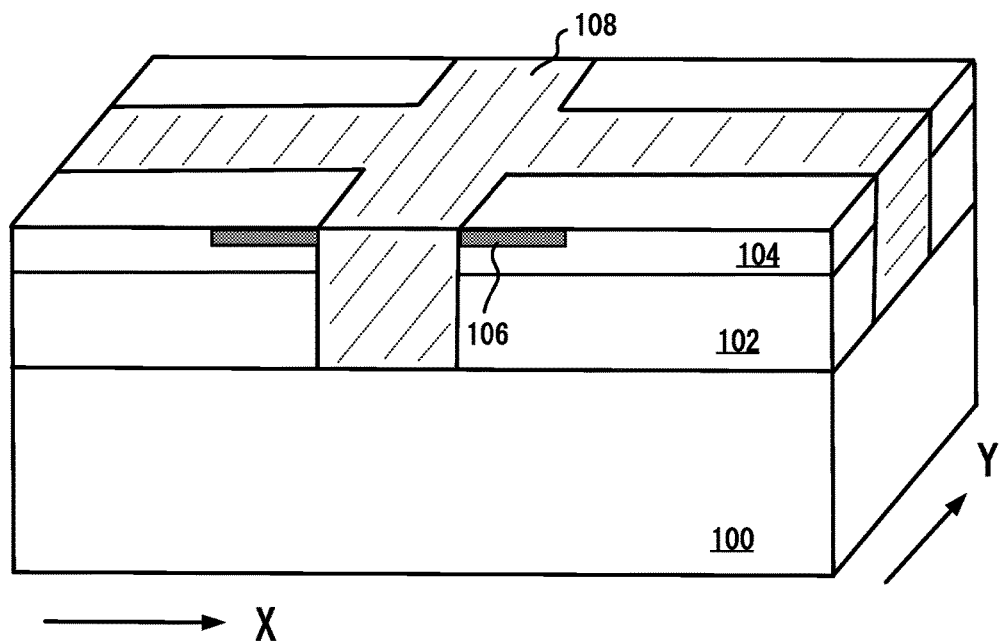
FIG. 1 depicts a schematic of a section of a device showing an isolation material deposited in trenches in both X and Y directions in accordance with one or more embodiments of the present disclosure.

FIG. 1 depicts a schematic of a section of a device showing an initial fabrication stage. A wafer 100 is doped with n-type implants. An epitaxial layer 102 of type n or n+ is implanted on the upper surface of the wafer 100. Note that the depth of various layers shown in figures are not drawn to scale. A p-type body region 104 is implanted on the upper surface of the epitaxial layer 102. N-type stripps 106 are then implanted in Y direction at regular interval pursuant to a desired source pitch, significant thereof to be discussed later in this document.

Trenches are then etched in cross section pattern. Trenches in Y direction overlaps the n-type layers 106. For the ease of description, only on portion of the trench pattern is being shown. In practice, the trench network will appear as shown in the plan view in FIG. 5. In one embodiment a dielectric material deposited on the trench walls. In another embodiment, the trenches are filled with a dielectric material 108. If the entire trench is filled with the dielectric material, a part of the dielectric material will need to be etched to create trenches for the source layer. As noted earlier, the process for performing above steps (e.g., implanting impurities, etching trenches, etc.) is well known in the art. If the dielectric material 108 is deposited on the walls of trenches or if a second set of trenches is etched after filling the first set of trenches with the dielectric material 108, the thickness of the dielectric layer 108 is typically between 100 nm and 600 nm depending upon desired drain characteristics.

It should be noted that patterns can be repeated on the wafer 100 and after the process described herein is completed, individual discrete devices can be cut out and packaged. The packaging includes forming metal contacts. In some embodiments and for example only, the trench width may be 6 micron for a 100v device and 4.5 micron for a 50v device.

Figure 2:
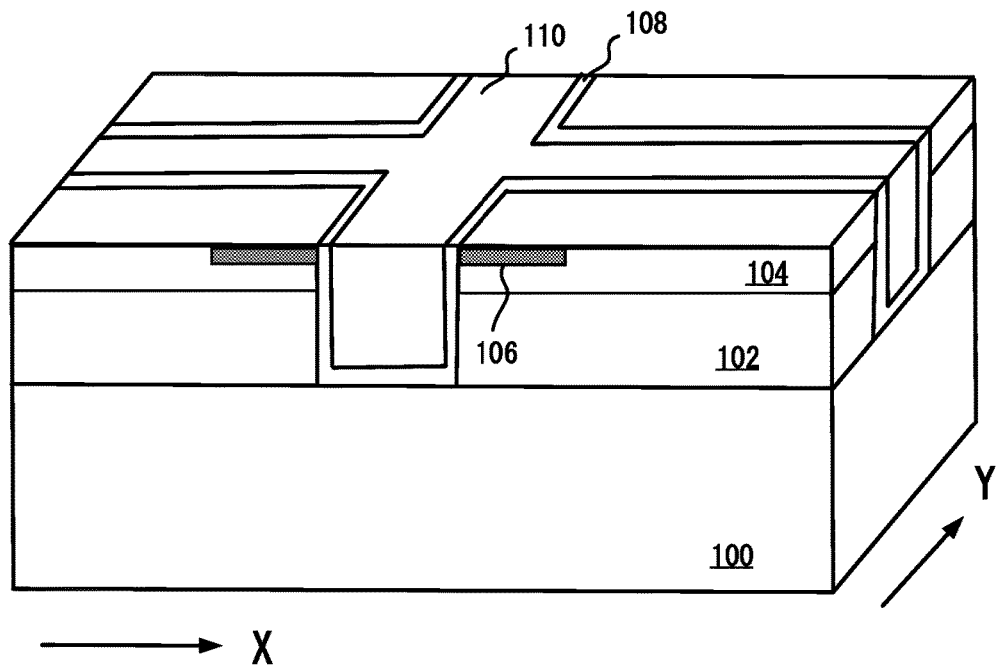
FIG. 2 illustrates a source layer deposited in trenches in the isolation layer in accordance with one of more embodiments of the present disclosure.

FIG. 2 illustrates a source layer 110 deposited in trenches. As stated above, the dielectric material 108 may be deposited on the walls of trenches described in FIG. 1. Alternatively, trenches are etched in the dielectric layer 108 when the first trenches are filled with the dielectric material 108. These new trenches have smaller width and depth than the width of the dielectric layer 108 such that a desired amount of dielectric is left between the trench wall and the body region layer 104 and the epitaxial layer 102. In these trenches, n-type polysilicon layer (source layer) 110 is deposited. After depositing the source layer 110, the chemical mechanical planarization (CMP) may be performed to make the top surface plain.

Figure 3:
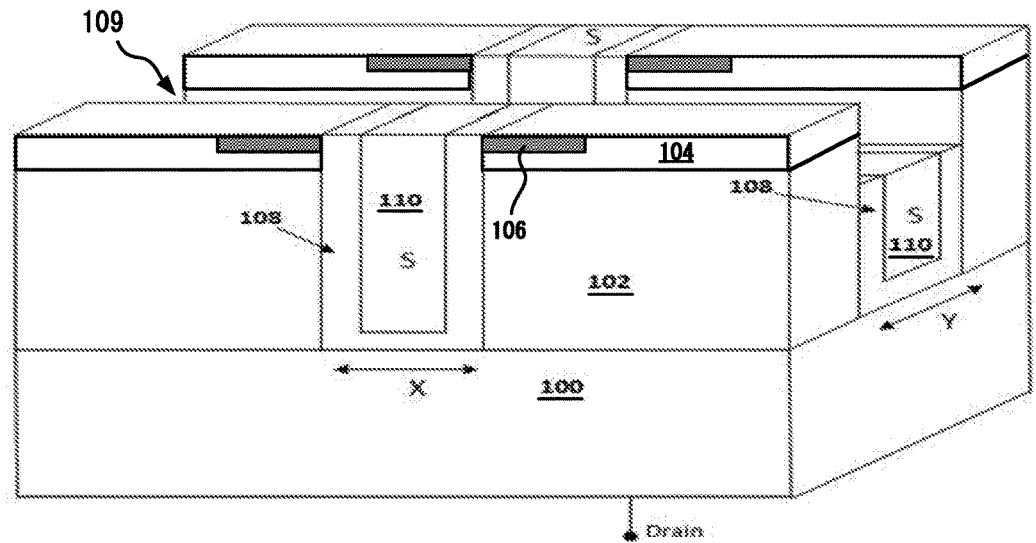
FIG. 3 depicts etched isolation and source layers in X direction in accordance with one or more embodiments of the present disclosure.
Figure 4:
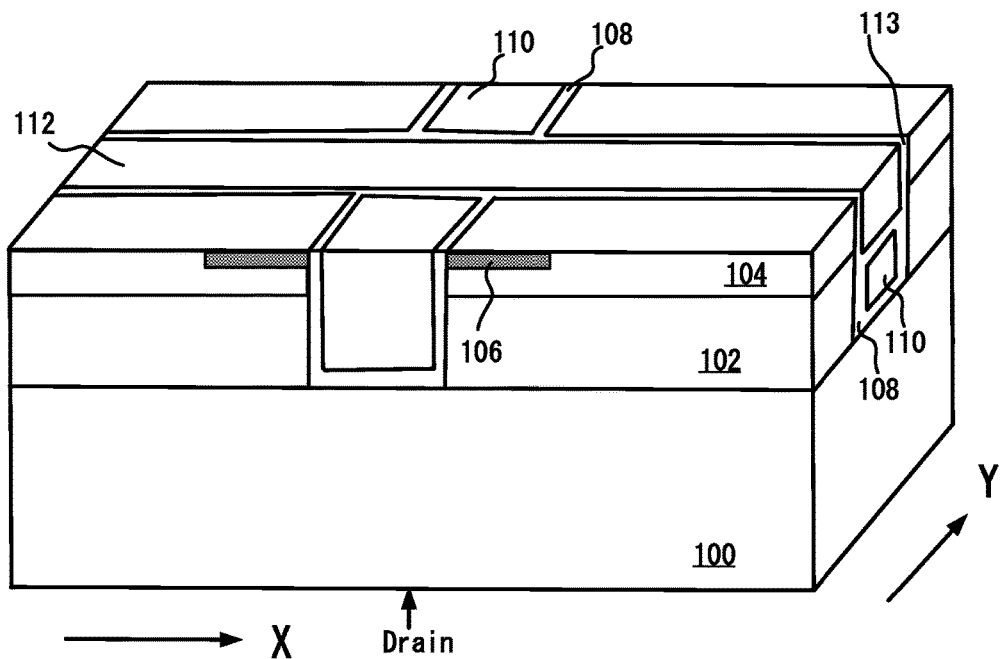
FIG. 4 depicts the gate layer formed over the source layer in X direction in accordance with one of more embodiments of the present disclosure.

FIG. 3 depicts a new set of trenches 109 in X direction. After the CMP process described above, photoresist is deposited over the surface such that the source layer 110 and adjacent oxide dielectric layer 108 are exposed in X direction only. Etching is then performed to etch away the dielectric layer 108 and the source layer 110 in X direction to a desired depth, as shown, based on desired electrical characteristics of the device being formed. After forming these trenches 109 in X direction only, the gate oxidation process is performed to deposit a thin layer 113 (FIG. 4) of dielectric on the bottom and walls of the trenches in X direction.

After depositing dielectric layer 113 on the walls and bottom on these trenches in X direction over the source layer 110, the gate layer 112 is formed by depositing n-type polysilicon in these trenches. The CMP process may be performed after forming the gate layer 112. Subsequently, a top isolation layer and contacts (not shown) for the source, the drain and the gate may be formed.

Figure 5:
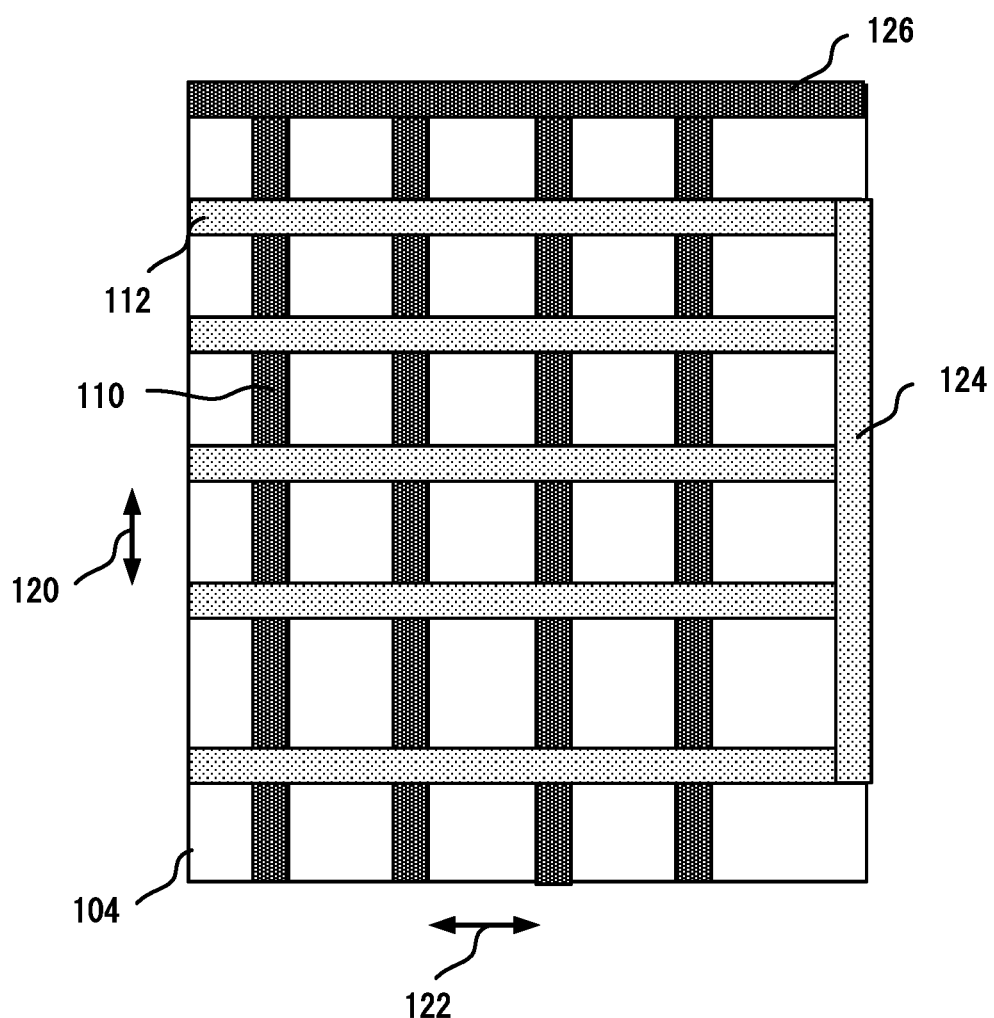
FIG. 5 depicts a top view of the device showing gate and source formations and gate and source contacts in accordance with one or more embodiments.

FIG. 5 depicts a top view of the device cut out from the wafer 100 showing gate 112 and source 110 lines and a gate contact 124 and a source contact 126. A trench for the source contact line 126 is formed together with the formation of the source layer 110 and the gate contact line 124 is formed with the trench in which the gate layer 112 is formed, as described in FIG. 3. The source contact line 126 is used for attaching a source metal contact and the gate contact line 124 is used for attaching a gate metal contact. A drain contact is attached to the wafer 100. As depicted the source contact line 126 is connected to the gate layer 110 in Y direction and the gate contact line 124 connects the gate layer 112 in X direction. Even though not shown in FIG. 5, it should be noted that the source layer 110 is also located under the gate layer 112. Further, as depicted, the source layer 110 comprises source lines laid out in both X and Y directions with the source lines in X direction intersects with the source lines in Y direction. The source lines in X direction are overlapped by the gate lines of the gate layer 112. In some embodiments, not all source lines in X direction may be overlapped by the gate lines.

The gate pitch 120 and the source pitch 122 may be varied for changing electrical characteristics of the device. With this square layout scheme the breakdown voltage (BVdss) can be greatly enhanced. The dynamic performance of the device can be optimized as the gate pitch 120 can be greater than the source pitch 122. Therefore, the gate-drain charge ($Q_{gd}$) can be smaller than the gate-source charge ($Q_{gs}$). Having $Q_{gd} <<< Q_{gs}$ improves gate bounce and spiking performance. The layout provided herein can be used to easily change the switching performance of a device depending upon a type of application simply by changing gate and source pitches. The dynamic performance can be improved due to a reduced density of gate polysilicon with a minimal impact of state resistance of the device (Rdson) because channel resistance is less than the distance between the top and bottom trenches (epitaxial resistance) for higher voltages.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A device comprising:
 a semiconductor substrate;
 a plurality of source lines formed on a surface of the semiconductor substrate, wherein the plurality of source lines are laid in both X and Y directions;
 a plurality of gate lines laid out over source lines in X direction in the plurality of source lines;
 a source contact line that connects source lines in the plurality of source lines that are terminating in Y direction;
 a gate contact line that connects the plurality of gate lines; and
 a drain contact.

2. The device of claim 1, wherein the surface of the semiconductor substrate includes an epitaxial layer.

3. The device of claim 2, wherein top surface of the epitaxial layer includes a p-type body implant.

4. The device of claim 1, wherein n-type layers run along the source lines in the plurality of source lines in Y direction.

5. The device of claim 1, wherein the gate lines protrude the surface of the semiconductor surface.

6. The device of claim 1, further including an isolation layer between the source layer and the gate layer.

7. The device of claim 6, wherein the isolation layer exists only in X direction.

8. The device of claim 1, wherein a distance between individual source lines in the plurality of source lines is user defined based for desired electrical characteristics of the device.

9. The device of claim 1, further includes an isolation layer buried in trenches to cover buried parts of the plurality of source lines.

* * * * *